United States Patent
Arabaci et al.

(10) Patent No.: US 10,547,333 B1
(45) Date of Patent: Jan. 28, 2020

(54) METHODS AND APPARATUS FOR FLEXIBLE OVERHEAD FORWARD ERROR CORRECTION (FEC) SUB-SYSTEM FOR OPTICAL FIBER COMMUNICATION SYSTEMS

(71) Applicant: Juniper Networks, Inc., Sunnyvale, CA (US)

(72) Inventors: Murat Arabaci, San Jose, CA (US); Marianna Pepe, San Jose, CA (US); Philip A. Thomas, San Jose, CA (US); David Ofelt, Los Gatos, CA (US); Massimiliano Salsi, Sunnyvale, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 6 days.

(21) Appl. No.: 15/904,921

(22) Filed: Feb. 26, 2018

Related U.S. Application Data

(63) Continuation of application No. 15/080,285, filed on Mar. 24, 2016, now Pat. No. 9,906,243.

(51) Int. Cl.
*H03M 13/00* (2006.01)
*H03M 13/35* (2006.01)
(Continued)

(52) U.S. Cl.
CPC ....... *H03M 13/353* (2013.01); *H03M 13/116* (2013.01); *H04B 10/40* (2013.01)

(58) Field of Classification Search
CPC .... H03M 13/353; H03M 13/116; H04B 10/40
See application file for complete search history.

(56) References Cited

U.S. PATENT DOCUMENTS 9,025,963 B2  5/2015  Malouin et al.
9,231,721 B1 *  1/2016  Varadarajan .......... H04J 3/1652

FOREIGN PATENT DOCUMENTS

EP  2819310 A1  12/2014

OTHER PUBLICATIONS

Hu, X-Y et al., "Efficient Implementations of the Sum-Product Algorithm for Decoding LDPC Codes," Global Telecommunications Conference, Nov. 2001, IEEE, vol. 2, pp. 1036-1036E.
(Continued)

*Primary Examiner* — Samir W Rizk
(74) *Attorney, Agent, or Firm* — Cooley LLP

(57) ABSTRACT

In some embodiments, an apparatus includes an optical transceiver which includes a rate-adaptive forward error correction (FEC) encoder and a rate-adaptive FEC decoder. The rate-adaptive FEC encoder is configured to adjust a number of a set of known symbols associated with a codeword to achieve rate adaption. A length of the codeword is fixed. The rate-adaptive FEC encoder is configured to generate the codeword based on (1) a set of information symbols including the set of known symbols and a set of data symbols, and (2) a fixed number of a set of parity symbols generated using information symbols. The rate-adaptive FEC decoder is configured to receive a set of reliability values associated with a channel word, and expand the set of reliability values to produce an expanded set of reliability values. The rate-adaptive FEC decoder is further configured to decode the expanded set of reliability values.

20 Claims, 6 Drawing Sheets

(51) Int. Cl.
*H03M 13/11* (2006.01)
*H04B 10/40* (2013.01)

(56) References Cited

OTHER PUBLICATIONS

Nelson, L. E. et al., "A Robust Real-Time 100G Transceiver With Soft-Decision Forward Error Correction [Invited]," J. Opt. Commun. Netw., vol. 4, No. 11, Nov. 2012, pp. B131-B141.

* cited by examiner

700

702 Receive, at a rate-adaptive forward error correction (FEC) encoder of an optical transceiver, a set of data symbols.

706 Combine, at the rate-adaptive FEC encoder, the set of data symbols with a set of known symbols to produce a set of information symbols, a number of the set of known symbols is adjustable based on an FEC overhead.

708 Generate, at the rate-adaptive FEC encoder, a set of parity symbols based on the set of information symbols, a number of the set of parity symbols being fixed.

710 Combine, at the rate-adaptive FEC encoder, the set of information symbols with the set of the parity symbols to produce a codeword.

712 Remove, at the rate-adaptive FEC encoder, the set of known symbols from the codeword to produce a channel word.

802 Receive, at a rate-adaptive forward error correction (FEC) decoder of an optical transceiver, a set of reliability values obtained by processing received samples associated with a transmitted channel word, a number of known symbols associated with a codeword, and locations of known symbols.

804 Expand the set of reliability values physically or virtually.

806 Provide the expanded set of reliability values to a set of check node processing units.

808 Power off a portion of the set of processing elements within a check node processing unit, achieving rate adaption without requiring a different hardware implementation for different FEC overheads, the portion of the set of processing elements associated with the known symbols.

810 Update the set of reliability values to produce a set of enhanced reliability values based on an update rule for a next decoding iteration and perform further decoding iterations until one or more stopping criteria are met.

FIG. 8

METHODS AND APPARATUS FOR FLEXIBLE OVERHEAD FORWARD ERROR CORRECTION (FEC) SUB-SYSTEM FOR OPTICAL FIBER COMMUNICATION SYSTEMS

CROSS-REFERENCE TO RELATED APPLICATION

This application is a continuation of U.S. patent application Ser. No. 15/080,285, filed on Mar. 24, 2016, (now U.S. Pat. No. 9,906,243) and entitled "Methods and Apparatus for Flexible Overhead Forward Error Correction (FEC) Sub-System for Optical Fiber Communication Systems," the disclosure of which is incorporated herein by reference in its entirety.

BACKGROUND

Some embodiments described herein relate generally to methods and apparatus for forward error correction (FEC) sub-systems for optical fiber communication systems. In particular, but not by way of limitation, some embodiments described herein relate to methods and apparatus for FEC sub-systems with flexible overhead capabilities for optical fiber communication systems.

Forward error correction (FEC) is a signal processing technique used to correct errors in data transmission over unreliable or noisy communication channels (e.g., optical fiber channels) to improve data reliability. FEC, based on a pre-determined algorithm, encodes original data information with redundant error-correction information (e.g., redundant parity symbols), which together with the original data information is transmitted to a receiver over the communication channel of interest. The redundant error-correction information allows the receiver to detect and correct errors that occur during the data transmission without retransmission of the original data information. As a result, by decoding the received information and correcting the errors, the receiver recovers the original data information.

As bandwidth demands for optical fiber communication systems increase and the tolerance for errors and latency decreases, different physical channels and different applications and services in optical fiber communication systems would benefit from varying error correction capabilities. Known FEC sub-systems for optical fiber communications, however, are unable to provide error correction capabilities with varying overhead (i.e., ratio of the redundant error-correction information over the original data information) without changing the hardware of the FEC.

Accordingly, a need exists for methods and apparatus for a FEC sub-system that provides flexible overhead capabilities for error correction in optical fiber communication systems without changing the hardware of the FEC.

SUMMARY

In some embodiments, an apparatus includes an optical transceiver that includes a rate-adaptive forward error correction (FEC) encoder and a rate-adaptive FEC decoder. The rate-adaptive FEC encoder is configured to adjust a number of a set of known symbols in a codeword to achieve rate adaption, where a length of the codeword is fixed. The rate-adaptive FEC encoder is configured to generate each codeword based on (1) a set of information symbols including the set of known symbols and a set of data symbols, and (2) a fixed number of a set of parity symbols generated using information symbols.

In some embodiments, the rate-adaptive FEC decoder is configured to receive a set of reliability values associated with a channel word, a number of a set of known symbols associated with codewords generated at the current FEC overhead, and a location of known symbols within codewords generated at the current FEC overhead. The set of known symbols might be divided into the set of groups of known symbols. The channel word corresponds to the codeword without the set of known symbols. The rate-adaptive FEC decoder is configured to expand the set of reliability values by inserting the highest possible reliability value at the locations of known symbols to produce an expanded set of reliability values. The rate-adaptive FEC decoder is further configured to decode the expanded set of reliability values.

BRIEF DESCRIPTION OF THE DRAWINGS

FIG. 7 is a flow chart illustrating a method of flexible overhead encoding at a rate-adaptive FEC encoder, according to an embodiment.

FIG. 8 is a flow chart illustrating a method of flexible overhead decoding at a rate-adaptive FEC decoder, according to an embodiment.

DETAILED DESCRIPTION

In some embodiments, an apparatus includes an optical transceiver that includes a rate-adaptive forward error correction (FEC) encoder and a rate-adaptive FEC decoder. The rate-adaptive FEC encoder is configured to adjust a number of a set of known symbols in a codeword to achieve rate adaption, where a length of the codeword is fixed. The rate-adaptive FEC encoder is configured to generate each codeword based on (1) a set of information symbols including the set of known symbols and a set of data symbols, and (2) a fixed number of a set of parity symbols, which in turn are generated using information symbols.

In some embodiments, the rate-adaptive FEC decoder is configured to receive a set of reliability values obtained by processing received samples associated with a transmitted channel word, a number of a set of known symbols associated with codewords generated at the current FEC overhead, and locations of known symbols. The set of known symbols might be divided into a set of groups of known symbols. The channel word corresponds to the codeword without the set of known symbols. The rate-adaptive FEC decoder is configured to expand the set of reliability values by inserting the highest possible reliability value at the locations of known symbols to produce an expanded set of reliability values.

The rate-adaptive FEC decoder is further configured to decode the expanded set of reliability values.

As used in this specification, the singular forms "a," "an" and "the" include plural referents unless the context clearly dictates otherwise. Thus, for example, the term "a processing element" is intended to mean a single processing element or multiple processing elements. For another example, the term "an optical transceiver" is intended to mean a single optical transceiver or multiple optical transceivers.

Figure 1:
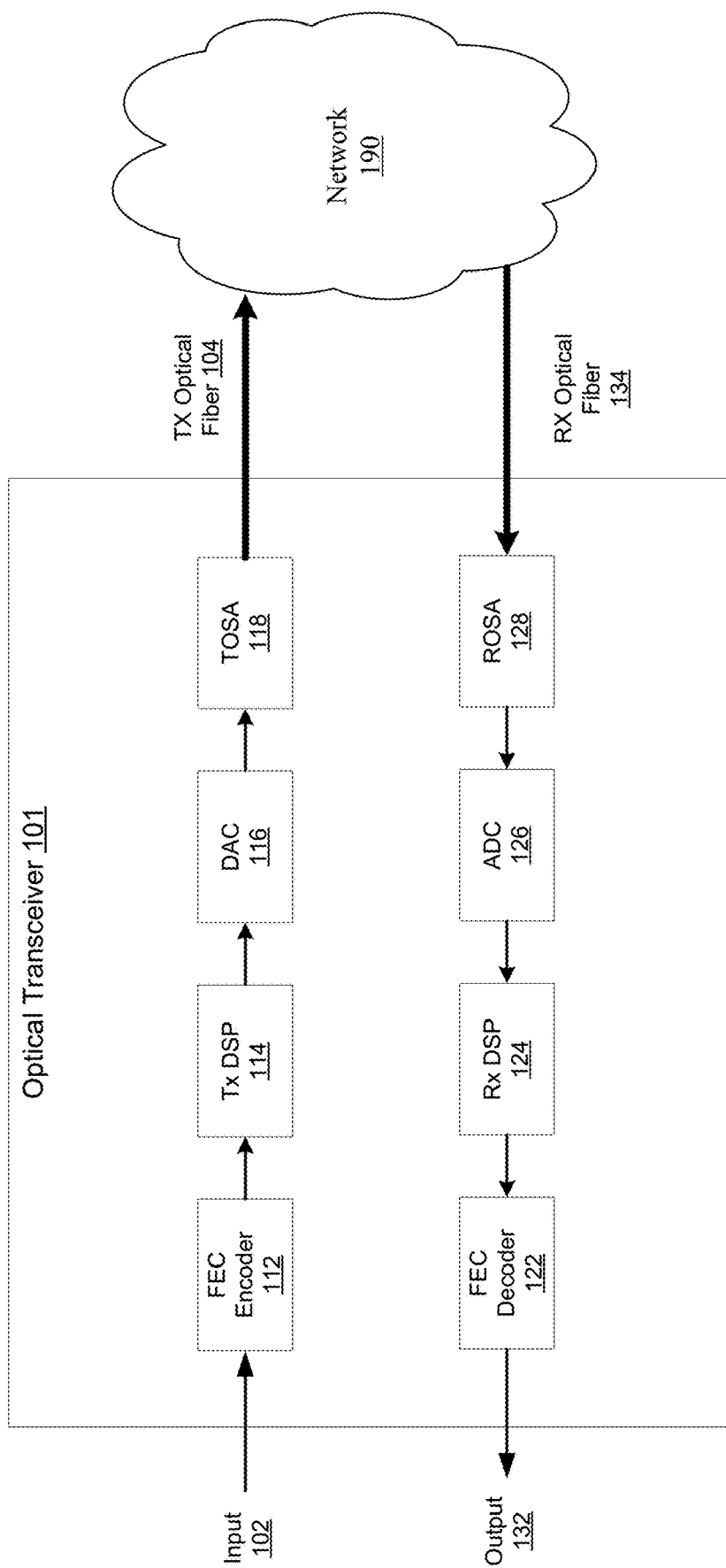
FIG. 1 is a block diagram illustrating an optical transceiver, according to an embodiment.

FIG. 1 is a block diagram illustrating an optical transceiver, according to an embodiment. The optical transceiver 101 can be any high data rate optical transceiver such as a transceiver implementing intensity modulation with direct detection, e.g., an on-off-keyed (OOK) transceiver, or a coherent optical transceiver, e.g., a coherent optical M-ary quadrature amplitude modulation (M-QAM) transceiver, a coherent polarization-multiplexed (PM) M-QAM transceiver, and/or the like. The transmitter portion of optical transceiver 101 can receive electrical signals as input 102 from an electrical circuit (e.g., a network processor located upstream, not shown in the figure); the receiver portion of optical transceiver 101 can send electrical signals as output 132 to the electrical circuit (e.g., a network processor located upstream, not shown in the figure). In other words, at the transmitter, data move from a processor (e.g., a network processor) located in the upstream to a fiber channel, i.e., downstream data movement. At the receiver, data move from a fiber channel to a processor (e.g., a network processor) located in the upstream, i.e., upstream data movement. The electrical circuit and the optical transceiver 101 can be included in an optical transceiver system (not shown in FIG. 1), and the electrical circuit is operatively coupled to the optical transceiver 101. The electrical circuit and the optical transceiver 101 can be physically separate as two modules/components, or integrated together within a single module, subsystem or component.

In coherent optical communication systems with a coherent optical transceiver, both magnitude and phase information are used for transmitting and receiving data such as for phase-shift keying modulation (e.g., BPSK, PM-BPSK, QPSK, PM-QPSK) or quadrature amplitude modulation (e.g., M-QAM, or PM-M-QAM). For example, in coherent optical communication systems, electro-optical components included in a receiver optical sub-assembly (ROSA) may rely on a beating between a received signal and a local reference which maps both magnitude and phase information of the received optical electric field in the optical signal to measurable voltage or current. For instance, coherent optical communication systems may require using a local carrier phase reference generated within ROSA for the reception of optical signals from network. For example, a ROSA may include optical hybrid mixers to convert the received optical signal into the pairs (e.g., in-phase and quadrature-phase) of data streams, referred to as I and Q data streams, respectively, for transmission to an analog-digital-converter (ADC).

The optical transceiver 101 can be operatively coupled to a network 190 via optical fibers (e.g., 104 and 134). The optical transceiver 101 can be configured to transmit optical signals to the network 190 via a TX optical fiber 104 and receive optical signals from the network 190 via an RX optical fiber 134. Examples of the network 190 include, but are not limited to, a fiber-optic network (e.g., a local area network (LAN), metropolitan area network (MAN), wide area network (WAN), or a long-haul network), or a converged network having functionalities of both a wireless network and a wired network.

The optical transceiver 101 includes a rate-adaptive FEC encoder 112, a transmit digital signal processor (Tx DSP) 114, a digital-to-analog converter (DAC) 116, a transmit optical sub-assembly (TOSA) 118, a rate-adaptive FEC decoder 122, a receiver digital signal processor (Rx DSP) 124, an analog-to-digital converter (ADC) 126, and a receiver optical sub-assembly (ROSA) 128. In particular, rate-adaptive FEC encoder 112 is connected to Tx DSP 114, which is in turn connected to DAC 116, which is in turn connected to TOSA 118. Similarly, ROSA 128 is connected to ADC 126, which is in turn connected to Rx DSP 124, which is in turn connected to the rate-adaptive FEC decoder 122. Each of the rate-adaptive FEC encoder 112, the Tx DSP 114, the DAC 116, the rate-adaptive FEC decoder 122, the Rx DSP 124, and the ADC 126 can be physically separate as an individual module/component/circuit, or integrated together within a single module, component, or circuit. Examples of such single modules include, but are not limited to, a general purpose processor, a field-programmable gate array (FPGA), an application specific integrated circuit (ASIC), a digital signal processor (DSP), a combination thereof, or other equivalent integrated or discrete logic circuitry.

The rate-adaptive FEC encoder 112 can be or can include a general purpose processor, a field-programmable gate array (FPGA), an application specific integrated circuit (ASIC), a combination thereof, or other equivalent integrated or discrete logic circuitry. The rate-adaptive FEC encoder 112 can also include a memory. The memory can be, for example, a random-access memory (RAM) (e.g., a dynamic RAM, a static RAM), a flash memory, a removable memory, and/or so forth. In some implementations, the memory can include, for example, a process, application, and/or some other software modules (stored and/or executing in hardware). The rate-adaptive FEC encoder 112 can receive a set of data signals as input 102 from an electrical circuit (e.g., a network processor located upstream) (not shown in the figure), where data signals are simply a stream of data symbols, and encodes the set of data signals based on a pre-determined algorithm. The rate-adaptive FEC encoder 112 can output a channel word associated with the set of data signals to the Tx DSP 114. The rate-adaptive FEC encoder 112 can encode the set of data signals in blocks of configurable length adjusted according to the given FEC overhead while keeping the number of the generated parity symbols fixed, achieving adjustable coding overhead (i.e., a ratio of the number of redundant parity symbols to the number of original data symbols) without changing the FEC hardware. In other words, rate adaption is achieved without requiring a different hardware implementation for a different FEC overhead. Details of the rate-adaptive FEC encoder 112 are described with regards to FIG. 2.

The transmit digital signal processor (Tx DSP) 114 can receive the electrical signals from the rate-adaptive FEC encoder 112 and perform appropriate signal processing such as spectral shaping, equalization for optical and electrical impairments, and other such signal processing to ensure that the highest fidelity transmit waveforms with desired characteristics are launched into the fiber upon digital-to-analog conversion and optical modulation.

The digital-to-analog converter (DAC) 116 receives digital electrical signals from the Tx DSP 114 and converts them to analog electrical signals. The analog electrical signals are then sent to the TOSA 118.

The transmit optical sub-assembly (TOSA) 118 includes electro-optical components that receive electrical signals from the DAC 116 and convert these electrical signals into a modulated optical signal. The electro-optical components can include drivers, modulators, splitters, combiners and attenuators, and the like. The TOSA transmits the optical signal to the network 190 via a single optical fiber (or multiple optical fibers) 104. For example, in polarization-multiplexed quadrature phase-shift keying (PM-QPSK) modulation, the electro-optical components can receive I/Q electrical data streams (i.e., electrical data streams to be carried in in-phase (I) and quadrature-phase (Q) within the modulated waveform) for both polarizations from the DAC 116, convert the I/Q electrical data streams into a PM-QPSK modulated optical signal, and transmit the optical signal to the network 190.

The rate-adaptive FEC decoder 122 can be or can include a general purpose processor, a field-programmable gate array (FPGA), an application specific integrated circuit (ASIC), a combination thereof, or other equivalent integrated or discrete logic circuitry. The rate-adaptive FEC decoder 122 can also include a memory. The memory can be, for example, a random-access memory (RAM) (e.g., a dynamic RAM, a static RAM), a flash memory, a removable memory, and/or so forth. In some implementations, the memory can include, for example, a process, application, and/or some other software modules (stored and/or executing in hardware). The rate-adaptive FEC decoder 122 can receive a set of reliability values or generate a set of reliability values from received samples associated with a channel word output from a rate-adaptive FEC encoder of an optical transceiver at a far end. The rate-adaptive FEC decoder 122 decodes the set of reliability values to detect and correct errors that might occur during the optical fiber transmission. The rate-adaptive FEC decoder 122 operates to determine the codeword within a sequence of received samples. The rate-adaptive FEC decoder 122 can substantially recover the data symbols within each codeword and send data signals containing recovered data symbols to an electrical circuit located upstream (e.g., a network processor). As discussed earlier, at the transmitter, data move from a processor (e.g., a network processor) located in the upstream to the fiber channel, i.e., downstream data movement. At the receiver, data move from the fiber channel to a processor (e.g., a network processor) located in the upstream, i.e., upstream data movement. The rate-adaptive FEC decoder 122 has substantially recovered the data signals when it satisfies one or more stopping criteria. Examples of stopping criteria may include converging to a codeword, reaching the maximum number of decoding iterations, etc. In one implementation, the rate-adaptive FEC encoder 112 and the rate-adaptive FEC decoder 122 can implement quasi-cyclic low-density parity-check (QC-LDPC) codes. Details of the rate-adaptive FEC decoder 122 are described with regards to FIG. 3.

The receiver digital signal processor (Rx DSP) 124 can receive the electrical signals and perform required signal processing such as phase and frequency tracking, equalization for optical and electrical impairments, and other signal processing to minimize or reduce the number of errors in the data received from the ADC 126. In one embodiment, Rx DSP can also produce the reliability values to be fed into the decoder from the received samples.

The analog-to-digital converter (ADC) 126 receives analog electrical signals from the ROSA 128 and converts them to digital electrical signals. The converted digital electrical signals are then sent to the Rx DSP 124 for digital signal processing.

The receiver optical sub-assembly (ROSA) 128 can receive an optical input signal from the network 190 via a single optical fiber (or multiple optical fibers) 134, and convert the optical signal into one or more electrical data streams. The electro-optical components housed within ROSA can include optical hybrids, photodetectors, transimpedance amplifiers and attenuators, and the like. For example, in polarization-multiplexed quadrature phase-shift keying (PM-QPSK) modulation, the ROSA can receive a PM-QPSK optical signal from network 190, convert the optical signal into I/Q electrical data streams, and transmit the I/Q electrical data streams to the ADC 126.

Figure 2:
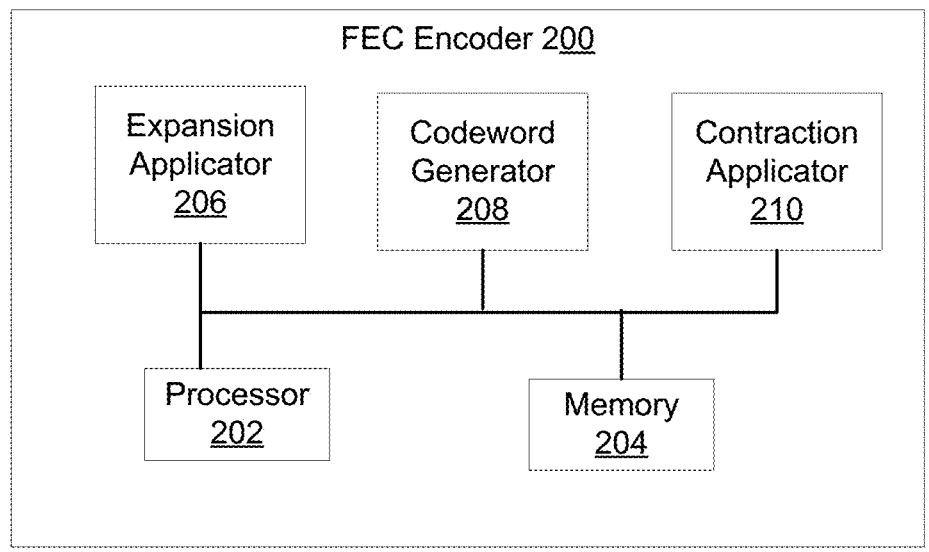
FIG. 2 is a block diagram illustrating a rate-adaptive FEC encoder, according to an embodiment.

FIG. 2 is a block diagram illustrating a rate-adaptive FEC encoder, according to an embodiment. The rate-adaptive FEC encoder 200 can be or can include a general purpose processor, a field-programmable gate array (FPGA), an application specific integrated circuit (ASIC), a combination thereof, or other equivalent integrated or discrete logic circuitry. The rate-adaptive FEC encoder 200 can be functionally and structurally similar to the rate-adaptive FEC encoder 112 described with regards to FIG. 1. The rate-adaptive FEC encoder 200 can receive a set of data signals as input from an electrical circuit (e.g., a network processor located upstream) (not shown in the figure) and encodes the set of data signals based on a pre-determined algorithm. The rate-adaptive FEC encoder 200 can be configured to output a channel word associated with the set of data signals to a Tx DSP (such as the Tx DSP 114 described in FIG. 1).

In one implementation, the rate-adaptive FEC encoder 200 and the rate-adaptive FEC decoder 300 (described below with regards to FIG. 3) can implement quasi-cyclic low-density parity-check (QC-LDPC) codes. In a QC-LDPC code, the parity-check matrix comprises an array of cyclic permutation matrices. Each cyclic permutation matrix can be solely defined by the position of the nonzero element on its first row and/or first column. In another implementation, the rate-adaptive FEC encoder 200 and the rate-adaptive FEC decoder 300 (described below with regards to FIG. 3) can implement other classes of linear block codes, e.g., Reed-Solomon (RS) codes, in a similar rate-adaptive fashion.

As shown in FIG. 2, the rate-adaptive FEC encoder 200 includes an expansion applicator 206, a codeword generator 208, a contraction applicator 210, a processor 202 and a memory 204. Each component (i.e., the expansion applicator 206, the codeword generator 208, the contraction applicator 210, the processor 202 and the memory 204) in the rate-adaptive FEC encoder 200 can be operatively coupled to each remaining component. Each component in the rate-adaptive FEC encoder 200 can be any combination of hardware and/or software (stored and/or executing in hardware) capable of performing one or more specific functions associated with that component. Although the expansion applicator 206, the codeword generator 208, and the contraction applicator 210 are shown separately in FIG. 2, each need not be physically separate from the other two.

The memory 204 can be, for example, a random-access memory (RAM) (e.g., a dynamic RAM, a static RAM), a flash memory, and/or so forth. In some implementations, the memory 204 can include, for example, a process, application, and/or some other software modules (stored and/or executing in hardware) or hardware modules configured to execute a flexible overhead encoding process. In such embodiments, instructions for executing the flexible overhead encoding process and/or the associated methods can be stored within the memory 204 and executed at the processor 202.

The processor 202 can be configured to, for example, write data into and read data from the memory 204, and execute the instructions stored within the memory 204. The processor 202 can also be configured to execute and/or control, for example, the operations of the expansion applicator 206, the codeword generator 208, and the contraction applicator 210. In some implementations, based on the methods or processes stored within the memory 204, the processor 202 can be configured to execute a flexible overhead encoding process, as described in FIG. 7.

The expansion applicator 206 can receive a set of data signals carrying data symbols from upstream (e.g., network processor). The expansion applicator 206 can expand a block of data symbols (D) with a block of known symbols (L) to produce a block of information symbols (K). The block of known symbols (L) can be stored in the memory 204. In one implementation, a length of the block of data symbols (D) and a length of the known symbols (L) depend on a selected FEC overhead, while a length of the block of information symbols (K) is fixed. The expansion applicator 206 can then send the block of information symbols (K) to the codeword generator 208 to generate a codeword. To achieve flexible-overhead implementation and rate adaption, the rate-adaptive FEC encoder 200 can adjust the length (i.e., the number) of the block of known symbols (L) based on an FEC overhead. For example, a length of the block of known symbols (L) is zero when an FEC overhead is set to a lowest FEC overhead amongst the FEC overheads that the rate-adaptive encoder and decoder pair is designed to support.

The codeword generator 208 can be configured to generate a codeword based on the block of information symbols (K). The codeword generator 208 can produce a block of parity symbols (M) from the block of information symbols (K) and combine the block of parity symbols (M) with the block of information symbols (K) to produce a codeword. In one implementation, the codeword and the block of information symbols (K) have a one-to-one relationship. In other words, a codeword is uniquely associated with a block of information symbols (K). The operation of codeword generation can be substantially the same for variable FEC overheads. The codeword generator 208 can send the generated codewords to the contraction applicator 210. In some implementations, the block of the information symbols (K) can be unaltered and presented as-is in the codeword. The block of parity symbols (M) is generated by the codeword generator 208 as linear combinations of the information symbols (K).

The contraction applicator 210 can be configured to receive the codeword and remove the known symbols (L) from the codeword to produce a channel word. The channel word, which includes the block of data symbols (D) and the block of parity symbols (M), can then be output from the contraction applicator 210 to a Tx DSP (such as the Tx DSP 114 in FIG. 1). In other words, the block of known symbols (L) is not transmitted to the Tx DSP, and therefore not transmitted to a network (such as the network 190 in FIG. 1). The configurations associated with the encoding (such as a number of known symbols, locations of the known symbols, etc.) can be communicated to an optical transceiver at a far end via the network (e.g., supervisory channels, network management systems, or within a block sent along with the payload at all times or at times when overhead and modulation format changes are to be introduced, etc.) such that DSP and rate-adaptive FEC decoder included in the optical transceiver at a far end can perform appropriate signal processing and decoding based on the configurations used during the encoding process.

Figure 4:
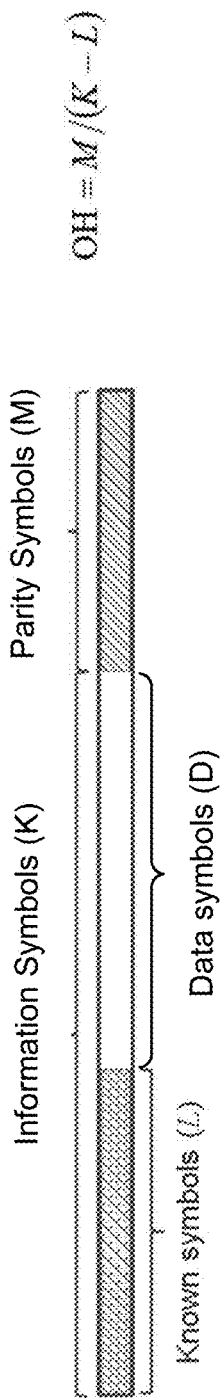
FIG. 4 is a diagram illustrating a codeword, according to an embodiment.

FIG. 4 shows a diagram illustrating a codeword, according to an embodiment. As discussed above, the expansion applicator 206 of the rate-adaptive FEC encoder 200 can combine a block of data symbols (D) with a block of known symbols (L). The block of data symbols (D) can be received from upstream. The block of information symbols (K) represent the combined block of known symbols (L) and the block of data symbols (D). The codeword generator 208 of the rate-adaptive FEC encoder 200 generates a block of parity symbols (M) based on the block of information symbols (K) to produce the codeword 400. The length of the block of information symbols (K) is fixed and the length of the block of parity symbols (M) is fixed. To achieve a flexible-overhead capability without implementing different FEC hardware for different overheads, the number of known symbols (L) can be varied. The FEC overhead can be defined as a ratio of the number of parity symbols (M) to the number of data symbols (D). The number of data symbols (D) is the number of information symbols (K) minus the number of known symbols (L). As a result, the FEC overhead decreases as the length of the block of data symbols (D) increases and the block of known symbols (L) decreases. The FEC overhead increases as the length of the block of data symbols (D) decreases and the length of block of known symbols (L) increases. As an example, the length of the block of known symbols (L) is zero when an FEC overhead is set to a lowest possible FEC overhead, where the block of information symbols (K) is formed entirely by the block of data symbols (D).

Referring back to FIG. 2, in some implementations, the block of data symbols (D) can be divided into a set of groups of data symbols. Each group of data symbols from the set of groups of data symbols has a size equal to a sub-matrix size (e.g., each dimension of a square, cyclic permutation matrix in a QC-LDPC code) of a parity-check matrix of the QC-LDPC codes. The block of known symbols (L) can also be divided into a set of groups of known symbols. Each group of known symbols from the set of groups of known symbols has a size also equal to the sub-matrix size of the parity-check matrix of the QC-LDPC codes. The expansion applicator 206 of the rate-adaptive FEC encoder 200 can combine the set of groups of data symbols and the set of groups of known symbols to form the block of information symbols (K) in a configurable order. The code generator 208 can be configured to generate the block of parity symbols (M) and augment them with the block of information symbols (K) to produce the codeword. The locations of each group of known symbols from the set of groups of known symbols can be made available to a rate-adaptive FEC decoder such that the rate-adaptive FEC decoder can decode the received word based on such information. In one implementation, the code generator 208 can place all groups of known symbols altogether at the beginning or at the end of the codeword. In a different implementation, the rate-adaptive FEC decoder performs necessary permutations such that the expanded reliability estimates corresponding to known symbols are placed altogether at the beginning or at the end of each block of expanded reliability estimates.

In another implementation, in addition to the block of data symbols (D) being divided into a set of groups of data symbols and the block of known symbols (L) being divided into a set of groups of known symbols, the block of parity symbols (M) generated by the codeword generator 208 can be divided into a set of groups of parity symbols. Each group of parity symbols from the set of groups of parity symbols also has a size equal to the sub-matrix size of the parity-check matrix of the QC-LDPC codes. The rate-adaptive FEC encoder 200 can combine the set of groups of data symbols, the set of groups of known symbols, and the set of groups of parity symbols to generate the codeword in a configurable order.

Various other implementations can be used. For example, when the group size of known symbols is set to a value that can divide the sub-matrix size, but not necessarily equal to the sub-matrix size, of the parity-check matrix of the QC-LDPC code, the implementation can be tweaked to take this fact into account with a moderate increase in implementation complexity, in particular, in decoder implementation complexity.

Figure 3:
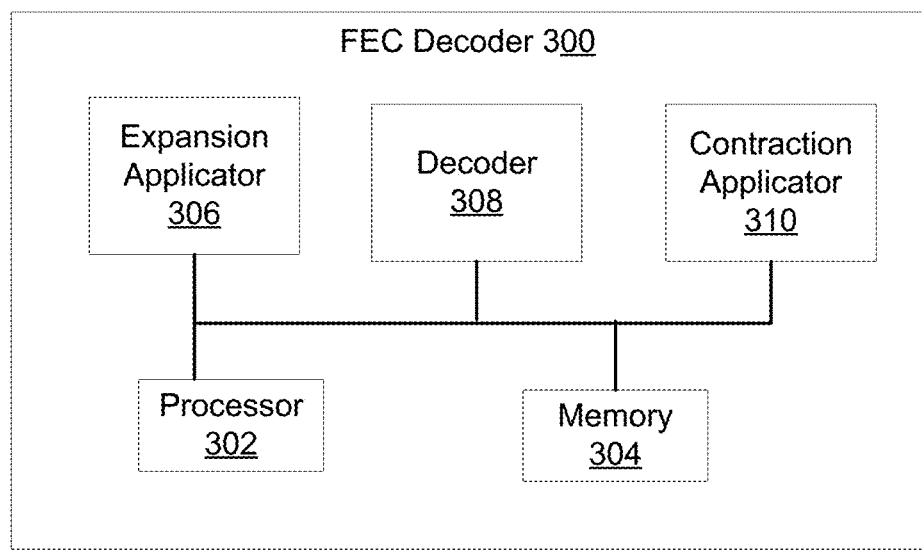
FIG. 3 is a block diagram illustrating a rate-adaptive FEC decoder, according to an embodiment.

FIG. 3 is a block diagram illustrating a rate-adaptive FEC decoder, according to an embodiment. The rate-adaptive FEC decoder 300 can be or can include a general purpose processor, a field-programmable gate array (FPGA), an application specific integrated circuit (ASIC), a combination thereof, or other equivalent integrated or discrete logic circuitry. The rate-adaptive FEC decoder 300 can be functionally and structurally similar to the rate-adaptive FEC decoder 122 described with regards to FIG. 1. The rate-adaptive FEC decoder 300 can be configured to receive a set of reliability values or generate a set of reliability values from received samples associated with a channel word output from a rate-adaptive FEC encoder in an optical transceiver at a far end. The rate-adaptive FEC decoder 300 decodes the set of reliability values to detect and correct errors that might occur during the optical fiber transmission. The rate-adaptive FEC decoder 300 determines the codeword within a sequence of received samples. The rate-adaptive FEC decoder 300 can substantially recover the data symbols within each received word and send data signals containing recovered data symbols to an electrical circuit located upstream (e.g., a network processor). The rate-adaptive FEC decoder 122 has substantially recovered the data signals when it satisfies one or more stopping criteria. Examples of stopping criteria may include converging to a codeword, reaching the maximum number of decoding iterations, etc. Similar to the rate-adaptive FEC encoder 200 described with regards to FIG. 2, the rate-adaptive FEC decoder 300 can implement quasi-cyclic low-density parity-check (QC-LDPC) codes.

The rate-adaptive FEC decoder 300 includes an expansion applicator 306, a decoder 308, a contraction applicator 310, a processor 302 and a memory 304. Each component (i.e., the expansion applicator 306, the decoder 308, the contraction applicator 310, the processor 302 and the memory 304) in the rate-adaptive FEC decoder 300 can be operatively coupled to each remaining component. Each component in the rate-adaptive FEC decoder 300 can be any combination of hardware and/or software (stored and/or executing in hardware) capable of performing one or more specific functions associated with that component. Although the expansion applicator 306, the decoder 308, the contraction applicator 310 are shown separately in FIG. 3, each need not be physically separate from the other two.

The memory 304 can be, for example, a random-access memory (RAM) (e.g., a dynamic RAM, a static RAM), a flash memory, and/or so forth. In some implementations, the memory 204 can include, for example, a process, application, and/or some other software modules (stored and/or executing in hardware) or hardware modules configured to execute a flexible overhead decoding process. In such embodiments, instructions for executing the flexible overhead decoding process and/or the associated methods can be stored within the memory 304 and executed at the processor 302.

The processor 302 can be configured to, for example, write data into and read data from the memory 304, and execute the instructions stored within the memory 304. The processor 302 can also execute and/or control, for example, the operations of the expansion applicator 306, the decoder 308, and the contraction applicator 310. In some implementations, based on the methods or processes stored within the memory 304, the processor 302 can be configured to execute a flexible overhead decoding process, as described in FIG. 8.

The expansion applicator 306 can be configured to receive a set of reliability values (i.e., soft information) derived from received samples associated with a channel word transmitted by an optical transceiver at a far end via a network. The configurations received by the rate-adaptive FEC decoder 300 matching those used by a rate-adaptive FEC encoder of the optical transceiver at the far end are also used by the expansion applicator 306. Such configurations can include a number of known symbols, and locations of known symbols. The set of reliability values represent reliability estimates of the received samples associated with a channel word, which includes a block of data symbols (D) and a block of parity symbols (M). The expansion applicator 306 can expand the set of reliability values by inserting the highest possible reliability value at the locations of known symbols to produce an expanded set of reliability values. The expanded set of reliability values has a size corresponding to a size of the codeword. The size of the expanded set of reliability values is greater than or equal to a size of the set of reliability values. In another implementation, the expansion can be virtually achieved. In this case, physical expansion for known symbols does not take place. Instead, only the incoming reliability estimates are carefully assigned to the corresponding memory elements leaving the values corresponding to the known symbols uninitialized.

The decoder 308 for QC-LDPC codes can include a set of check node processing units and a set of variable node processing units to decode the expanded set of reliability values. The set of check node processing units update the expanded set of reliability values iteratively, while the set of variable node processing units can be considered as being mapped to the memory 304. In other words, the processing can be said to be check-node-centric. At each check node processing unit, the decoder 308 can update the a posteriori and a priori information on the variable nodes contributing to a given check node. The set of check node processing units can continue updating the expanded set of reliability values until one or more stopping criteria are met (e.g., the codeword is recovered, and/or a pre-determined number of iterations is reached, etc.). To facilitate efficient hardware implementation and support flexible overhead capabilities, the number of check node processing units remains fixed.

Specifically, the decoder 308 can be configured to initially receive the expanded set of reliability values and update the expanded set of reliability values to produce a set of enhanced reliability values. These enhanced reliability values serve as a priori information for the next decoding iteration. In LDPC decoding, the check nodes mainly operate on extrinsic information. Extrinsic information about a variable node connected to a check node is the information that excludes the a priori information that the check node already has about the variable node that it operates on. Extrinsic information is substantially obtained by removing (e.g., subtracting) the a priori information from the a posteriori information. In some embodiments, updates on a posteriori and a priori information are explicitly stated and updates on extrinsic information are implied without the loss of generality. If one or more stopping criteria are not met (e.g., the codeword could not be recovered, and/or less than a pre-determined number of iterations is executed, etc.), the decoder 308 can continue to update the set of enhanced reliability values.

In some implementations, each check node processing unit can be implemented as a set of processing elements interconnected in a binary-tree-like structure (such as the binary-tree-like structure described below with regards to FIG. 5). To achieve flexible overhead capability without requiring different hardware implementations for different FEC overheads, the decoder 308 can be configured to power off a portion of the set of processing elements (such as processing element 506, 507, 504 in FIG. 5) associated with the block of known symbols (L).

Figures 5, 6:
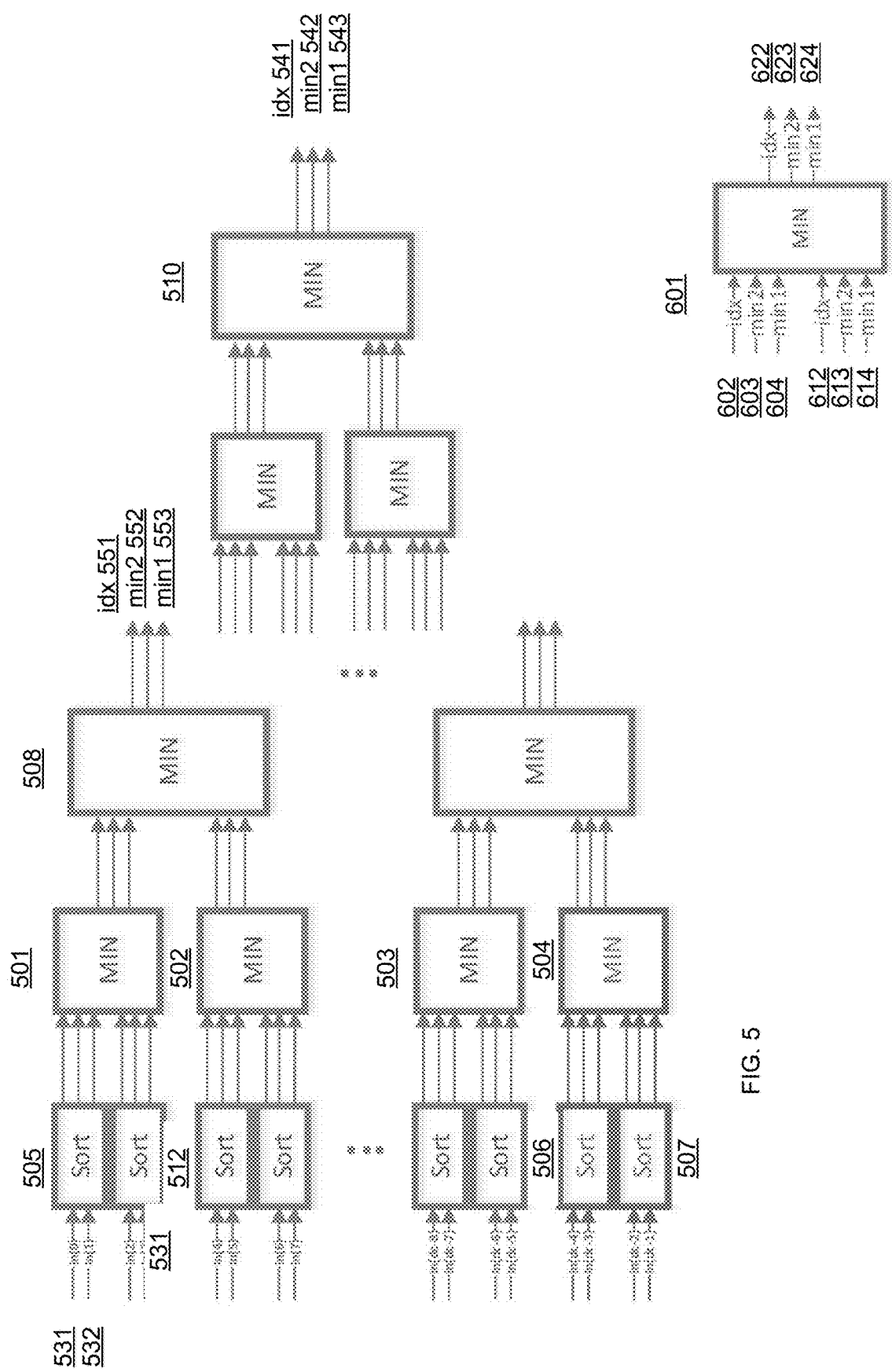
FIG. 5 is a block diagram illustrating a binary-tree-like structure of a set of processing elements within a rate-adaptive FEC decoder, according to an embodiment.
FIG. 6 is a block diagram illustrating a min processing element, according to an embodiment.

FIG. 5 shows a block diagram illustrating a binary-tree-like structure of a set of processing elements within a check node processing unit of a rate-adaptive FEC decoder, according to an embodiment. As shown in FIG. 5, the set of processing elements includes a set of sort operators (e.g., 505, 506, 507) and a set of minimum operators (e.g., 501, 502, 503, 504, 508, 510) interconnected in a binary-tree-like structure. Each minimum operator from a first set of minimum operators (e.g., 501, 502, 503, 504) is operatively coupled to a first sort operator (e.g., 505) from a set of sort operators and a second sort operator (e.g., 512) from the set of sort operators. Each minimum operator from a second set of minimum operators is operatively coupled to two minimum operators from the set of minimum operators at one stage lower in the binary-tree-like structure, e.g., 508 is connected to 501 and 502.

The function of each minimum operator of the set of minimum operators is illustrated in a block diagram in FIG. 6, according to an embodiment. As shown in FIG. 6, each min operator 601 can receive two sets of input signals, a first set of input signals (602-604) and a second set of input signals (612-614), and produce an output set of signals (622-624). Each of the first set of input signals (602-604) and the second set of input signals (612-614) includes (1) a first minimum value (e.g., 604, 614), (2) a second minimum value (e.g., 603, 613), and (3) a leaf index of the first minimum value (e.g., 602, 612), where leaves of the binary-tree-like structure are referred to as an ordered set of inputs to the sort operators, e.g., a set of dc leaves that are depicted in FIG. 5. Each minimum operator 601 can select a lesser value between (1) a first minimum value from the first set of input signals 604 and (2) a first minimum value from the second set of input signals 614 to generate a first minimum value of an output set of signals 624. Each minimum operator 601 can select a leaf index between 602 or 612 corresponding to the first minimum value that prevails as the first minimum value of the output set of signals to set a leaf index of the output set of signals 622. Each minimum operator can also be configured to determine a lesser value between (i) an unselected value of (1) the first minimum value from the first set of input signals 604 and (2) the first minimum value from the second set of input signals 614, and (ii) a second minimum value from a set of input signals whose first minimum value is selected as the first minimum value of the output to generate a second minimum value of the output set of signals 623.

Referring back to FIG. 5, each sort operator from the set of sort operators (e.g., 505, 512, 506, 507) can receive at most two input reliability values (531 and 532) of the set of reliability values associated with adjacent leaves of the binary-tree-like structure. Before being fed to the sort operators, the reliability value at each leaf is stored as sign and magnitude of the reliability value. The sort operators are presented with the magnitude of corresponding reliability values only. Each sort operator from the set of sort operators (e.g., 505, 512, 506, 507) can be configured to sort between at most two input reliability values (531 and 532) to provide an output set of signals including (1) a first minimum value, (2) a second minimum value, and (3) a leaf index of the first minimum value.

To determine enhanced reliability values, the decoder 308 can compare a leaf index at an output of the binary-tree-like structure 541 with a leaf index of each leaf of the set of leaves of the binary tree (e.g., 531). When the leaf index of a leaf from the set of leaves of the binary tree (e.g., 531) is different from the leaf index at the output of the binary-tree-like structure 541, the decoder 308 can assign to that leaf an enhanced reliability value that is equal to a first minimum value at the output of the binary-tree-like structure 543. When the leaf index of a leaf from the set of leaves of the binary tree (e.g., 531) matches the leaf index at the output of the binary-tree-like structure 541, the decoder 308 can assign to that leaf an enhanced reliability value that is equal to a second minimum value at the output of the binary-tree-like structure 542. In order to finalize the enhanced reliability value associated with each leaf, the decoder 308 multiplies the enhanced reliability value obtained above with the product of the stored signs of input reliability values of all leaves except for the leaf being operated on.

In other implementations, different ways to process the reliability values during iterative decoding of LDPC codes while achieving rate-adaptive LDPC decoding can be used. For example, the decoder 308 can include check node processing units composed of a first set of processing elements, a second set of processing elements and a set of two-input sum operators. The set of sum operators interconnected in a binary-tree-like summation structure produces a single output value by summing the outputs of the first set of processing elements and relays this value to the second set of processing elements. The decoder 308 matches each input of the two-input sum operators at the lowest stage of the binary-tree-like structure of the set of sum operators to one of elements of the set of incoming reliability values. The cardinality of the set of reliability values is equal to the number of variable nodes connected to the check node being processed by the check node processing unit. The reliability value at each leaf is stored as sign and magnitude of the reliability value. The following operators are presented with the magnitude of corresponding reliability values only. Before reaching the input of the corresponding summation operator, each incoming reliability value passes through one of the first set of processing elements. Each processing element from the first set of processing elements can apply a desired function to its input signals, e.g., a log-tan h function, or an approximation to a log-tan h function or any other function of choice. Each sum operator at a higher summation stage from the set of sum operators can receive outputs of two neighboring sum operators at an immediately lower summation stage from the set of sum operators. Each sum operator at a given summation stage from the set of sum operators can pass its output to at most one sum operator at an immediately higher summation stage. Each sum operator at the lowest summation stage from the set of sum operators can receive outputs from the corresponding processing element from the first set of processing elements. A sum operator at a root of the binary-tree-like summation structure from the set of sum operators can generate an output of the binary-tree-like summation structure. The output of the binary-tree-like structure is passed to the second set of processing elements. The cardinality of the second set of processing elements is also the same as the number of variable nodes connected to the check node being processed by the check node processing unit. The decoder 308 matches each processing element from the second set of processing elements to a leaf of the binary-tree-like summation structure of the first set of sum operators. Each processing element from the second set of processing elements can receive the output of the binary-tree-like summation structure and an output of the corresponding processing element from the first set of processing elements. Each processing element from the second set of processing elements can subtract the output of the corresponding processing element from the first set of processing elements from the output of the binary-tree-like summation structure to produce an intermediate data, and passes the intermediate data through a desired function, e.g., a log-tan h function, or an approximation to a log-tan h function or any other function of choice. In order to finalize the enhanced reliability value associated with each leaf at the current decoding iteration, the decoder 308 multiplies the corresponding output of the second processing element with the product of the stored signs of input reliability values of all leaves except for the leaf being operated on. The decoder 308 can power off a portion of the first set of processing elements, a portion of the second set of processing elements and a portion of the binary-tree-like summation structure, achieving rate adaption without requiring different hardware implementations for different FEC overheads. The portion of the first set of processing elements, the portion of the second set of processing elements and the portion of the binary-tree-like summation structure can be associated with the block of known symbols (L).

The contraction applicator 310 can receive the decoded word from the decoder 308 and remove the block of parity symbols (M) from the decoded word to produce the block of data symbols (D). The contraction applicator 310 can then forward the block of data symbols (D) to a processor located upstream (e.g., a network processor).

FIG. 7 is a flow chart illustrating a method of flexible overhead encoding at a rate-adaptive FEC encoder, according to an embodiment. This method can be implemented at a rate-adaptive FEC encoder 200 (e.g., processor 202 or memory 204 of a rate-adaptive FEC encoder 200 as discussed in FIG. 2) of an optical transceiver. The method includes receiving, at a rate-adaptive forward error correction (FEC) encoder (such as the rate-adaptive FEC encoder 112 described in FIG. 1 or the rate-adaptive FEC encoder 200 described in FIG. 2) of an optical transceiver (such as the optical transceiver 101 described in FIG. 1), a set of data signals at 702. In one embodiment, the optical transceiver includes the rate-adaptive FEC encoder and a rate-adaptive FEC decoder (such as the FEC decoder 300 described in FIG. 3). In another embodiment, the optical transceiver can be a dedicated source of signals, and thus, it includes only the rate-adaptive FEC encoder without the rate-adaptive FEC decoder. In yet another embodiment, the optical transceiver includes only the rate-adaptive FEC decoder without the rate-adaptive FEC encoder. An expansion applicator (such as the expansion applicator 206 at the rate-adaptive FEC encoder 200 in FIG. 2) receives data signals carrying the set of data symbols and it expands each set of data symbols (D) with a set of known symbols (L) to produce a set of information symbols (K) at 706. The number of the block of data symbols (D) and a number of the known symbols (L) depend on a selected FEC overhead, while a number of the block of information symbols (K) is fixed. The expansion applicator 206 then sends the block of information symbols (K) to a codeword generator (such as the codeword generator 208 in FIG. 2) to generate a codeword.

The codeword generator generates a set of parity symbols based on the set of information symbols at 708 and combines the set of parity symbols (M) with the set of information symbols (K) to produce a codeword at 710. A number of the set of parity symbols is fixed. The codeword and the block of information symbols (K) have a one-to-one relationship. In other words, a codeword is uniquely associated with the set of information symbols (K). The codeword generator can send the codeword to a contraction applicator (such as the contraction applicator 210 in FIG. 2). In one implementation, the rate-adaptive FEC encoder and the rate-adaptive FEC decoder implement quasi-cyclic low-density parity-check (QC-LDPC) codes. In a QC-LDPC code, the parity-check matrix is comprised of an array of cyclic permutation matrices. Each cyclic permutation matrix can be solely defined by the position of the nonzero element on its first row and/or first column.

The contraction applicator receives the codeword and removes the set of known symbols (L) from the codeword to produce a channel word at 712. The channel word, which includes the set of data symbols (D) and the set of parity symbols (M), can then be outputted from the contraction applicator and sent downstream to be processed by Tx DSP. In other words, the block of known symbols (L) is not transmitted to the network. The configurations associated with the encoding (such as a number of known symbols, locations of known symbols, etc.) are sent to an optical transceiver at a far end via the network (e.g., supervisory channels, network management systems, or within a block prefixed to the payload at all times or at times when overhead and modulation format changes are to be introduced, etc.) such that DSP and a rate-adaptive FEC decoder included in the optical transceiver at a far end can perform appropriate signal processing and decoding based on the configurations used during the encoding process.

FIG. 8 is a flow chart illustrating a method of flexible overhead decoding at a rate-adaptive FEC decoder, according to an embodiment. This method can be implemented at a rate-adaptive FEC decoder (e.g., processor 302 or memory 304 of a rate-adaptive FEC decoder 300 as discussed in FIG. 3) of an optical transceiver. The method includes receiving, at an expansion applicator (such as the expansion applicator 306), a set of reliability values associated with a transmitted channel word, a number of known symbols associated with a codeword, and locations of the known symbols at 802. The set of reliability values represent reliability estimates of received samples associated with a transmitted channel word, which includes a block of data symbols (D) and a block of parity symbols (M). The channel word corresponds to the codeword without the set of known symbols. In case of QC-LDPC codes, the set of known symbols can be considered to be divided into a set of groups of known symbols. Each group of known symbols from the set of groups of known symbols has a size equal to the sub-matrix size of the parity-check matrix of the QC-LDPC codes. The expansion applicator then expands the set of reliability values by inserting the highest possible reliability value at the location of each group of known symbols from the set of groups of known symbols to produce an expanded set of reliability values at 804. The expanded set of reliability values has a size corresponding to a size of the codeword. The size of the expanded set of reliability values is greater than or equal to a size of the set of reliability values.

A decoder (such as the decoder 308 in FIG. 3) might include a set of check node processing units, each comprised of a set of processing elements, which in turn are interconnected in a binary-tree-like structure (such as the binary-tree-like structure described with regards to FIG. 5). The set of processing elements includes a set of sort operators (e.g., 505, 506, 507) and a set of minimum operators (e.g., 501, 502, 503, 504, 508, 510) interconnected in the binary-tree-like structure. At each decoding iteration, the decoder provides the corresponding subset of the expanded set of reliability values to the check node processing units at 806. The decoder powers off a portion of the set of processing elements within each check node processing unit corresponding to known symbols and hence prevents them from affecting the decoding process, and therefore, it effectively accomplishes decoding at a different code rate. In other words, the rate-adaptive decoder achieves rate adaption without requiring a different hardware implementation for a different FEC overhead at 808. The portion of the set of processing elements being powered off is associated with the set of known symbols.

The decoder updates the set of reliability values to produce a set of enhanced reliability values based on an update rule for a next decoding iteration and performs further decoding iterations until one or more stopping criteria are met at 810. Specifically, the decoder updates the a posteriori information on the variable nodes contributing to a given check node. The set of check node processing units continues updating the expanded set of reliability values until one or more stopping criteria are met (e.g., the codeword is recovered, and/or a pre-determined number of iterations is reached, etc.). To facilitate efficient hardware implementation and support flexible overhead capability, the number of check node processing units remains fixed. Similarly, the decoder initially receives the expanded set of reliability values and updates the expanded set of reliability values to produce a set of enhanced reliability values. These enhanced reliability values serve as a priori information for the next decoding iteration. If one or more stopping criteria are not met (e.g., the codeword could not be recovered, and/or less than a pre-determined number of iterations is executed, etc.), the decoder continues to update the set of enhanced reliability values.

Some embodiments described herein relate to a computer storage product with a non-transitory computer-readable medium (also can be referred to as a non-transitory processor-readable medium) having instructions or computer code thereon for performing various computer-implemented operations. The computer-readable medium (or processor-readable medium) is non-transitory in the sense that it does not include transitory propagating signals per se (e.g., a propagating electromagnetic wave carrying information on a transmission medium such as space or a cable). The media and computer code (also can be referred to as code) may be those designed and constructed for the specific purpose or purposes. Examples of non-transitory computer-readable media include, but are not limited to: magnetic storage media such as hard disks, floppy disks, and magnetic tape; optical storage media such as Compact Disc/Digital Video Discs (CD/DVDs), Compact Disc-Read Only Memories (CD-ROMs), and holographic devices; magneto-optical storage media such as optical disks; carrier wave signal processing modules; and hardware devices that are specially configured to store and execute program code, such as Application-Specific Integrated Circuits (ASICs), Programmable Logic Devices (PLDs), Read-Only Memory (ROM) and Random-Access Memory (RAM) devices. Other embodiments described herein relate to a computer program product, which can include, for example, the instructions and/or computer code discussed herein.

Examples of computer code include, but are not limited to, micro-code or microinstructions, machine instructions, such as produced by a compiler, code used to produce a web service, and files containing higher-level instructions that are executed by a computer using an interpreter. For example, embodiments may be implemented using imperative programming languages (e.g., C, Fortran, etc.), functional programming languages (Haskell, Erlang, etc.), logical programming languages (e.g., Prolog), object-oriented programming languages (e.g., Java, C++, etc.) or other suitable programming languages and/or development tools. Additional examples of computer code include, but are not limited to, control signals, encrypted code, and compressed code.

While various embodiments have been described above, it should be understood that they have been presented by way of example only, and not limitation. Where methods described above indicate certain events occurring in certain order, the ordering of certain events may be modified. Additionally, certain of the events may be performed concurrently in a parallel process when possible, as well as performed sequentially as described above.

What is claimed is:

1. A method, comprising:
   receiving, at an optical transceiver, a plurality of data symbols;
   generating, at the optical transceiver, a plurality of information symbols based on the plurality of data symbols and a plurality of known symbols, a number of the plurality of known symbols being adjustable based on a forward error correction (FEC) overhead of the optical transceiver;
   generating, at the optical transceiver, a plurality of parity symbols based on the plurality of information symbols;
   determining, at the optical transceiver, a codeword based on the plurality of information symbols and the plurality of the parity symbols; and
   sending (1) a channel word associated with the codeword and (2) a characteristic associated with the plurality of known symbols including the number of the plurality of known symbols, in response to (1) a data symbol from the plurality of data symbols being sent or (2) the FEC overhead of the optical transceiver being changed.

2. The method of claim 1, wherein a number of the plurality of parity symbols is fixed.

3. The method of claim 1, further comprising:
   removing the plurality of known symbols from the codeword to produce the channel word.

4. The method of claim 1, wherein:
   the determining, at the optical transceiver, the codeword includes combining the plurality of information symbols and the plurality of the parity symbols.

5. The method of claim 1, wherein the channel word includes the plurality of data symbols and the plurality of parity symbols.

6. The method of claim 1, wherein the codeword and the plurality of information symbols have a one-to-one relationship.

7. The method of claim 1, wherein the number of the plurality of known symbols is zero when the FEC overhead is set to a lowest FEC overhead of a plurality of FEC overheads that the optical transceiver operates at.

8. The method of claim 1, wherein:
the generating, at the optical transceiver, the plurality of parity symbols includes a linear combination of the plurality of data symbols and the plurality of known symbols.

9. The method of claim 1, wherein the characteristic associated with the plurality of known symbols includes a location of each known symbol from the plurality of known symbols in the codeword.

10. The method of claim 1, further comprising:
dividing the plurality of data symbols into a plurality of groups of data symbols,
dividing the plurality of known symbols a plurality of groups of known symbols,
the generating the plurality of information symbols includes combining the plurality of groups of data symbols and the plurality of groups of known symbols, an order in which each group of data symbols from the plurality of groups of data symbols and each group of known symbols from the plurality of groups of known symbols are placed while generating the plurality of information symbols being configurable.

11. The method of claim 10, wherein each group of data symbols from the plurality of groups of data symbols has a size equal to a submatrix size of a parity-check matrix of quasi-cyclic low-density parity-check (QC-LDPC) codes.

12. The method of claim 1, further comprising:
dividing the plurality of data symbols into a plurality of groups of data symbols,
dividing the plurality of known symbols a plurality of groups of known symbols,
dividing the plurality of parity symbols into a plurality of groups of parity symbols,
the determining, at the optical transceiver, the codeword includes combining the plurality of groups of data symbols, the plurality of groups of known symbols, and the plurality of groups of parity symbols, an order in which each group of data symbols from the plurality of groups of data symbols, each group of known symbols from the plurality of groups of known symbols, and each group of parity symbols from the plurality of groups of parity symbols are placed while forming the codeword is configurable.

13. A method, comprising:
receiving, at a rate-adaptive forward error correction (FEC) decoder of an optical transceiver, (1) a first plurality of reliability values associated with a channel word, and (2) a characteristic associated with a plurality of known symbols;
generating, at the rate-adaptive FEC decoder, a second plurality of reliability values based on the first plurality of reliability values, a size of the second plurality of reliability values being greater than or equal to a size of the first plurality of reliability values;
powering off a portion of the rate-adaptive FEC decoder based on the plurality of known symbols; and
decoding, at the rate-adaptive FEC decoder and after the portion of the rate-adaptive FEC decoder being powered off, the second plurality of reliability values such that rate adaption is achieved without requiring a different hardware implementation for different FEC overheads of the optical transceiver.

14. The method of claim 13, wherein:
the generating, at the rate-adaptive FEC decoder, the second plurality of reliability values includes inserting a highest possible reliability value at a location of each known symbol from the plurality of known symbols.

15. The method of claim 13, wherein:
the characteristic associated with the plurality of known symbols includes at least one of (1) a number of the plurality of known symbols, and (2) a location of each known symbol from the plurality of known symbols in a codeword, the channel word corresponding to the codeword with the plurality of known symbols removed.

16. The method of claim 13, wherein:
a size of the second plurality of reliability values is equal to a size of a codeword, the channel word corresponding to the codeword with the plurality of known symbols removed.

17. The method of claim 13, further comprising:
updating, at the rate-adaptive FEC decoder, the second plurality of reliability values to produce a plurality of enhanced reliability values based on an update rule for a next decoding iteration; and
performing, at the rate-adaptive FEC decoder, further decoding iterations until one or more stopping criteria are met.

18. An apparatus, comprising:
a rate-adaptive forward error correction (FEC) decoder including a processor and a memory operatively coupled to the processor,
the processor configured to receive (1) a first plurality of reliability values associated with a channel word, and (2) a characteristic associated with a plurality of known symbols,
the processor configured to generate a second plurality of reliability values based on the first plurality of reliability values, a size of the second plurality of reliability values being greater than or equal to a size of the first plurality of reliability values,
the processor configured to power off a portion of the rate-adaptive FEC decoder based on the plurality of known symbols, and
the processor configured to decode, after the portion of the rate-adaptive FEC decoder is powered off, the second plurality of reliability values such that rate adaption is achieved without requiring a different hardware implementation for a different FEC overhead.

19. The apparatus of claim 18, wherein:
the rate-adaptive FEC decoder includes a plurality of check node processing units, each check node processing unit from the plurality of check node processing units including a plurality of processing elements interconnected in a binary-tree-like structure,
the powering off the portion of the rate-adaptive FEC decoder includes powering off a portion of the plurality of processing elements within each check node processing unit.

20. The apparatus of claim 18, wherein:
the rate-adaptive FEC decoder includes a plurality of check node processing units, each check node processing unit from the plurality of check node processing units including (1) a first plurality of processing elements, (2) a second plurality of processing elements and (3) a plurality of two-input sum operators, the plurality of two-input sum operators interconnected in a binary-tree-like summation structure,
the plurality of two-input sum operators configured to produce a summed output value by summing an output of the first plurality of processing elements and relay the summed output value to the second plurality of processing elements, the powering off the portion of the rate-adaptive FEC decoder includes powering off a portion of the first plurality of processing elements, a portion of the second plurality of processing elements and a portion of the plurality of two-input sum operators.

* * * * *